US006973402B1

(12) United States Patent　　(10) Patent No.: US 6,973,402 B1
Lin　　(45) Date of Patent: Dec. 6, 2005

(54) SYSTEM FOR TESTING INTEGRATED CIRCUITS

(75) Inventor: Yih-Min Lin, Hsinchu (TW)

(73) Assignee: PROGenic Technology Co., Ltd., Hsinchu (TW)

( * ) Notice: Subject to any disclaimer, the term of this patent is extended or adjusted under 35 U.S.C. 154(b) by 0 days.

(21) Appl. No.: 10/869,522

(22) Filed: Jun. 16, 2004

(51) Int. Cl.$^7$ .............................................. G06F 19/00
(52) U.S. Cl. ...................... 702/108; 702/117; 702/118; 702/121
(58) Field of Search ........................ 702/108, 117, 118, 702/119, 121, 122, 123, 130, 182; 714/724, 714/741, 744; 324/755, 758, 765; 438/126, 438/127

(56) References Cited

U.S. PATENT DOCUMENTS 6,392,427 B1 *　5/2002　Yang ........................... 324/755
6,730,545 B1 *　5/2004　Chang et al. ................ 438/112

* cited by examiner

Primary Examiner—Bryan Bui
(74) Attorney, Agent, or Firm—Apex Juris, pllc; Tracy M Heims

(57) ABSTRACT

A system for testing integrated circuits by testing the change of integrated circuits under various temperatures comprises: at least one two-dimensional matrix testing module which includes a testing section having arrays for plugging integrated circuits to be tested, a heating section corresponding with the above testing section for heating integrated circuits respectively; a computer mainframe for connecting said two-dimensional matrix testing module and controlling the whole operations of the testing system, and a database. With the above-described structure, said database and said two-dimensional matrix testing module can be connected with the computer mainframe such that the temperature control information can be transmitted to provide each heater of said heating section to generate a suitable temperature, heat the integrated circuit to be tested, and store the test information.

13 Claims, 4 Drawing Sheets

SYSTEM FOR TESTING INTEGRATED CIRCUITS

BACKGROUND OF THE INVENTION

1. Field of the Invention

The present invention relates to a system for testing integrated circuits, and particularly, to a test system with respect to a set of integrated circuits to be tested which are located at different positions in at least one two-dimensional matrix testing module, comprising heating the integrated circuits with various temperatures, respectively, to have the integrated circuits to be tested at different positions each reaching a different specific temperature, and thus achieving the object of shortening the total testing time horizon and saving the total cost of testing through heating an individual integrated circuit and heating stably.

2. Description of the Prior Art

It had been recognized that, since the working environment of an integrated circuit most likely is much higher than room temperature, in order to understand whether the characteristics of the integrated circuit is changed under such a high temperature environment and its operating stability is further affected, a system for testing integrated circuits can be used to have the integrated circuits reaching a specific temperature and then carried out the testing.

Conventional systems for testing integrated circuits most likely can only classify integrated circuits into various chambers in accordance with the temperature to be tested and heat with hot air to a specific temperature and carry out the testing.

However, the above-mentioned conventional systems for testing integrated circuits have the following disadvantages in practice:

1. Each chamber can only heat a number of integrated circuits with the same temperature simultaneously, and can not heat individual integrated circuit according to its own requirement of the different testing temperature respectively.

2. Since distances of various integrated circuits from the air outlet are different with respect to one another, the way of heating with hot air in the chamber usually brings a situation of heating unevenly and the accuracy and the quality of the testing are hence affected severely.

3. Each chamber can carry out only one testing temperature each time, the testing time horizon will increase if there are many temperatures to be tested.

In view of disadvantages in practice derived from the above conventional testing systems, the present inventor has accumulated a lot of personal practical experience on the development business of related industry for many years and, after studying intensively, develops finally a system for testing integrated circuit.

SUMMARY OF THE INVENTION

Accordingly, the major object of the present invention is to provide a system for testing integrated circuits, which can heat each integrated circuit with respect to the individual testing temperature requirement and can heat stably, so as to achieve the aim of shortening the total testing time horizon and increasing the accuracy and the quality of the testing, as well as saving the total cost of testing. In order to achieve the above object, the testing system according to the present invention comprises:

at least one two-dimensional matrix testing module, including: a testing section that can provide arrays for plugging multiple integrated circuits to be tested, a heating section corresponding to the above testing section, wherein said array is provided with multiple heaters in a manner that the integrated circuits can be heated respectively;

a computer mainframe, being used to connect the said two-dimensional matrix testing modules and control the whole operations of said testing system; and a database, being used to store temperature control data by connecting said computer mainframe and said two-dimensional matrix testing module, and to provide a suitable temperature to every heater on said heating section for heating integrated circuits to be tested and store up the test information;

wherein, all heaters of said two-dimensional matrix testing module are independent with one another, wherein the testing temperature of each integrated circuit to be tested can be transmitted from said computer mainframe to each heater of said two-dimensional matrix testing module for execution, and, can transmit the test information of each integrated circuit to said computer mainframe and saved into said database.

BRIEF DESCRIPTION OF THE DRAWINGS

The drawings disclose an illustrative embodiment of the present invention which serves to exemplify the various advantages and objects hereof, and are as follows.

| [Representative symbols of main components] | |
|---|---|
| 1  two-dimensional matrix testing module | 2  testing section |
| 21  semiconductor testing circuit | 22  semiconductor test board |
| 23  socket | 3  heating section |
| 31  control circuit | 32  substrate |
| 33  heater | 331  top seat |
| 332  socket unit | 333  heating column |
| 334  offseter | 335  connection unit |
| 336  compressive spring | 337  pressure gauge |
| 338  heating circuit | 339  temperature sensing circuit |
| 4  chamber | 5  cooling unit |
| 6  computer mainframe | 61  procedure controlling unit |
| 62  temperature controlling unit | 63  signal output unit |
| 64  measuring unit | 7  database |
| 8  PLR module | 9  integrated circuit |

DETAILED DESCRIPTION OF THE PREFERRED EMBODIMENT

Figure 1:
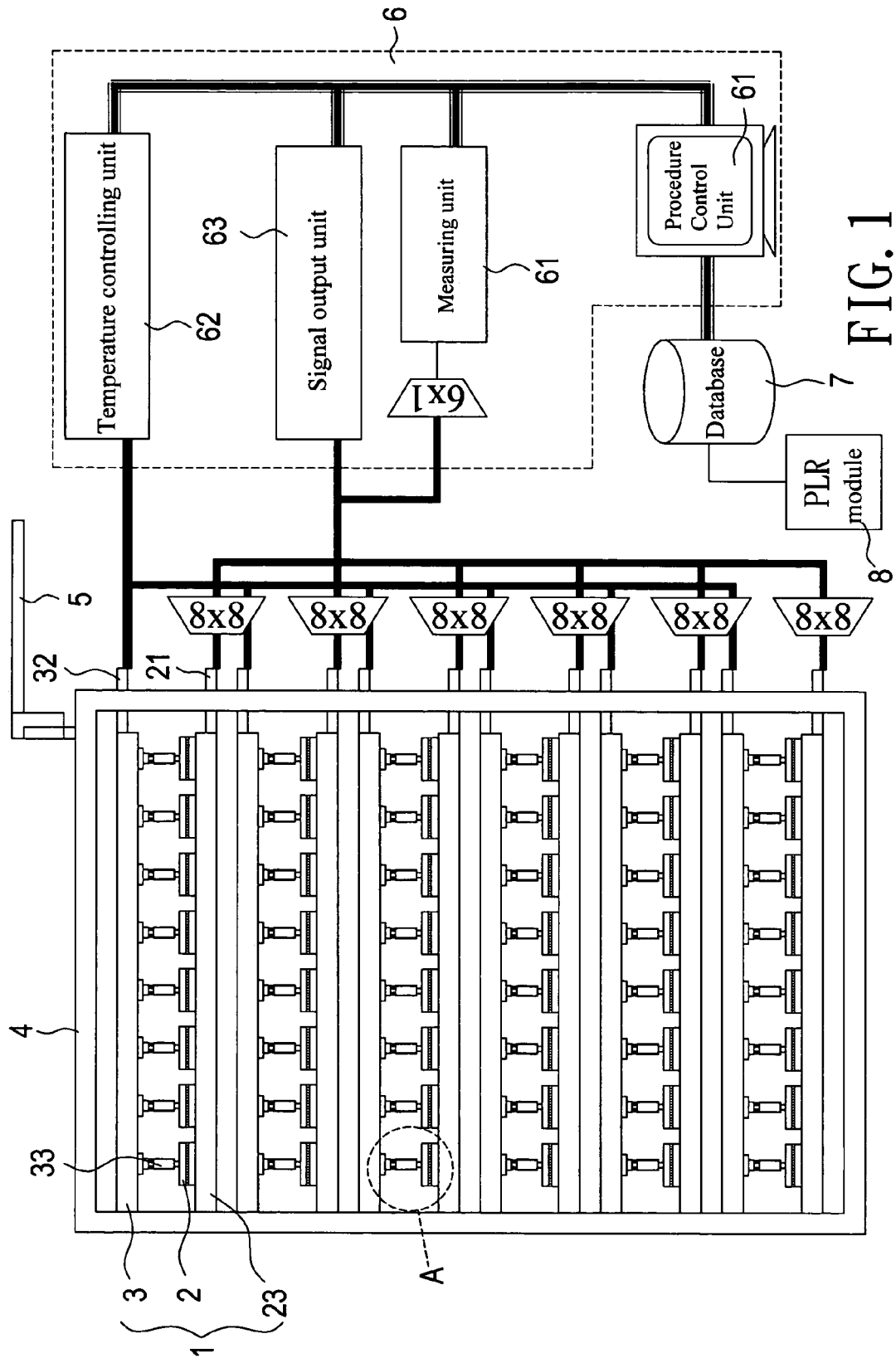
FIG. 1 is a schematic view of the system for testing integrated circuits according to the invention.
Figure 2:
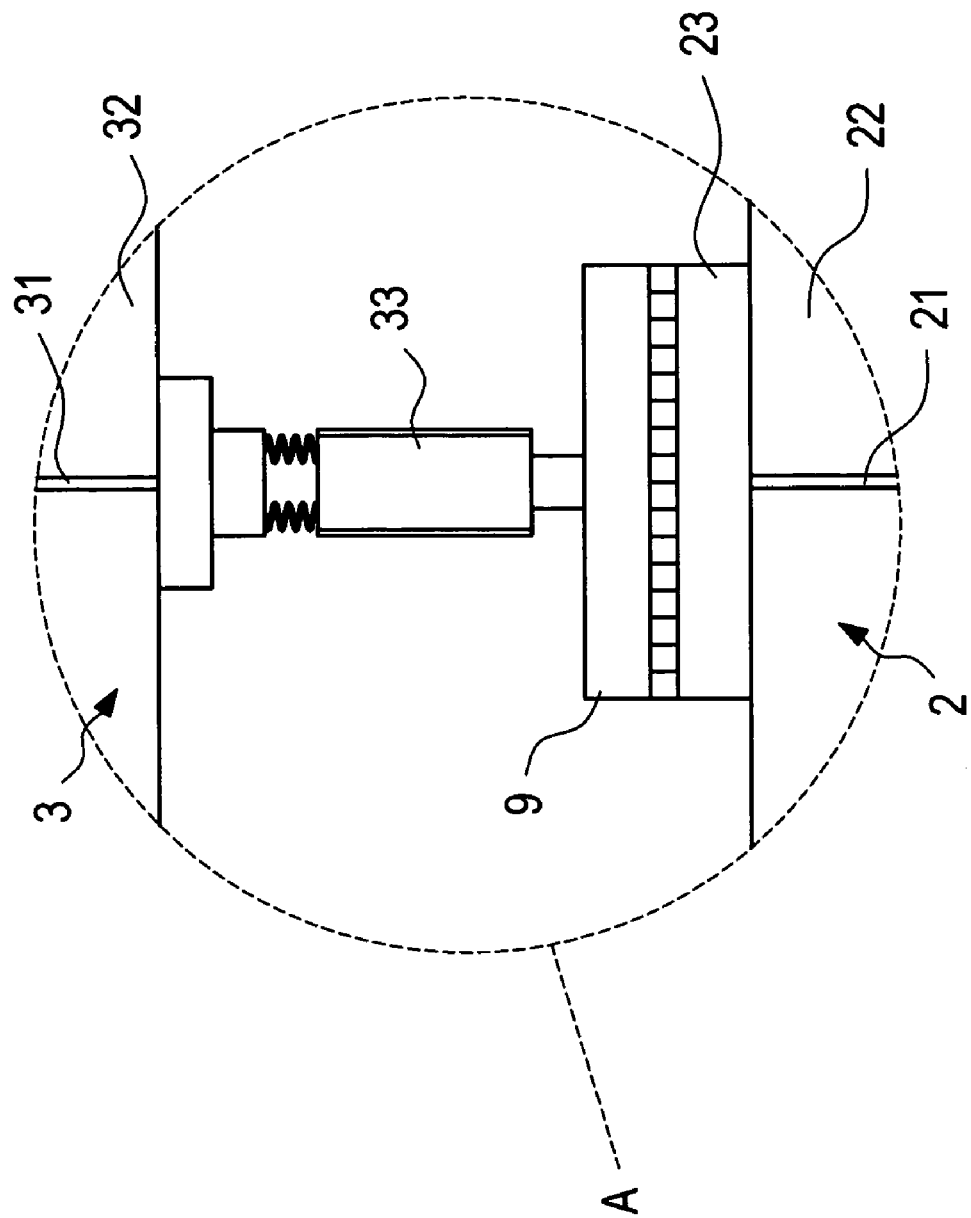
FIG. 2 is a partial schematic view of the two-dimensional matrix testing module of the system for testing integrated circuits according to the invention.
Figure 4:
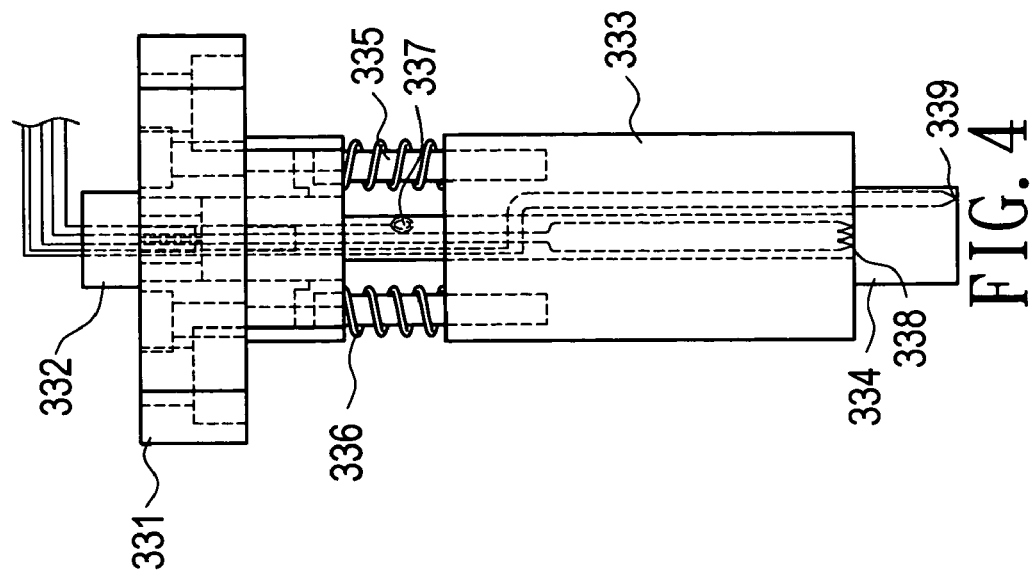
FIG. 4 is a exploded view of the heater head according to the invention.

In order to have the structure, the use and the characteristics of the system for testing integrated circuits according to the invention to be further understood deeply, accurately and fully, the inventor presents preferred embodiments and describes in conjunction with accompanying diagrams as follows:

First please referring to FIGS. 1 and 2, the system for testing integrated circuits according to the present invention comprises:

- a three-dimensional matrix, formed by six two-dimensional matrix testing modules 1 in a manner that said six two-dimensional matrix testing modules 1 can be installed in one chamber 4, said two-dimensional matrix testing module 1 comprising:
- one testing section 2 which comprises a semiconductor circuit 21 provided on a semiconductor test board 22, and 8×8 sockets 23 provided on said semiconductor testing board 22 in a manner that said integrated circuits 9 to be tested can be plugged therein respectively, and that said multiple sockets 23 are connect to said semiconductor testing circuit 21 respectively;
- one heating section 3, corresponding to said testing section 2, and comprising a control circuit 31 on a substrate 32, and 8×8 heaters 33 provided in correspondence with said multiple sockets 23 on said substrate 32 in a manner that said integrated circuits 9 can be heated respectively, and that said multiple heaters 33 connect to said control circuit 31, respectively;
- wherein said control circuit 31 can transmit the test information of desired temperature of every said integrated circuit 9 to be tested to the corresponding heater 33 for carrying out the heating, and outputs the test information of said integrated circuits 9 via said semiconductor test circuit 21.

Figure 3:
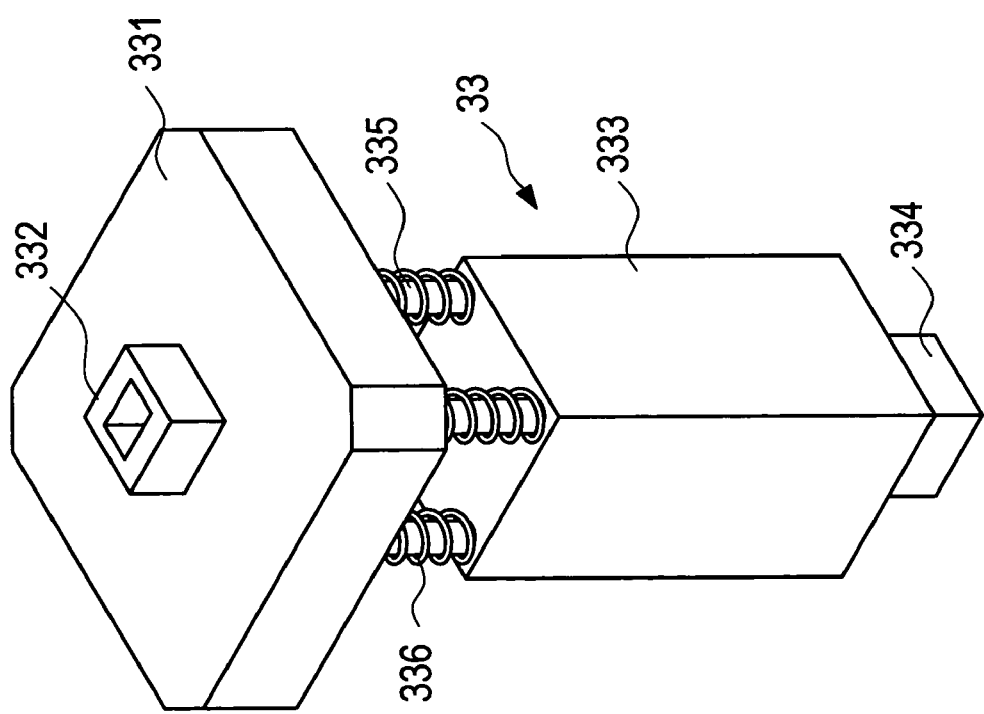
FIG. 3 is a three-dimensional view of the heater head according the invention.

The above-described heater 33, as shown in FIGS. 2 and 3, comprises:

- a top seat 331, provided thereon with a socket unit 332 that can be inserted in the substrate of said heating section 3 for positioning said heater 33;
- a heating column 333, installed beneath said top seat 331, wherein a offseter 334 is provided bulging form the bottom of said heating column 333;
- a connection unit 335, being a multiple plug bar whose both ends connect to said top seat 331 and said heating column 333 respectively, wherein a compressive spring 336 is provided around said plug bar between said top seat 331 and said heating column 333;
- a pressure gauge 337, installed between said top seat 331 and said heating column 333 and used to measure the pressure change as said heating column 333 contacting said integrated circuit 9 to be tested;
- a heating circuit 338, being provided by penetrating through said heating column 333 for heating said heating column 333;
- a temperature sensing circuit 339, being provided by penetrating through said heating column 333 to sense the temperature of said offseter 334 at the bottom of said heating column 333;
- wherein, by contacting said offseter 334 to said integrated circuit 9, the integrated circuit 9 is heated up to a prescribed testing temperature, and, when the temperature of said offseter 334 is higher than the prescribed testing temperature of said integrated circuit 9, the temperature sensing circuit 339 can sense the signal and stop the heating of said heating circuit 338;
- a cooling unit 5, as shown in FIG. 1, being connected to said chamber 4 for enabling said integrated circuits 9 in saud two-dimensional matrix testing module 1 in the chamber 4 cooling fast after the testing.

A computer mainframe 6, as shown in FIG. 1, for connecting said two-dimensional matrix testing module 1 and controlling the whole operation of said testing system comprises:

- a procedure controlling unit 61, for transmitting test data and controlling the progress of the testing;
- a temperature controlling unit 62, which can input the temperature control data of each integrated circuits 9 to be tested which located at different position into each specific position of each two-dimensional matrix module 1 for execution, respectively;
- a signal output unit 63, connected to each semiconductor testing circuit 21 of the two-dimensional matrix testing module 1 for detecting the pressure coefficient of each integrated circuit 9 in said two-dimensional matrix testing module 1 and transmitting the test information to said procedure controlling unit 61;
- a measuring unit 64, connected to each semiconductor testing circuit 21 in the two-dimensional matrix testing module 1, and transmitting the test information of the characteristic change of each integrated circuit 9 in each two-dimensional matrix testing module 1 under various specific temperatures to said procedure controlling unit 61;
- a database 7, as shown in FIG. 1, connected to said two-dimensional matrix testing module 1 via said computer mainframe 6 for storing the temperature control data, using said procedure control unit 61 to read and then provide to each heater 33 on said heating section 3 the temperature control data in the database 7 for generating a suitable temperature, heating the integrated circuit 9 to be tested, and inputting the test information from each integrated circuit 9 to said database 7 for storing said test information, wherein the test information stored in the database 7 can be analyzed by a PLR module 8 and then return the analyzed data to said database 7,
- wherein each said socket seat 23 of said two-dimensional matrix testing module 1 and each corresponding heater 33 are independent each other, and wherein the related test temperature of each integrated circuit 9 to be tested can transmit to each heater 33 for execution under the control of said computer mainframe 6, and, the test information of each integrated circuit 9 can be transmitted into the computer mainframe 6 and stored in the database 7.

Figure 5:
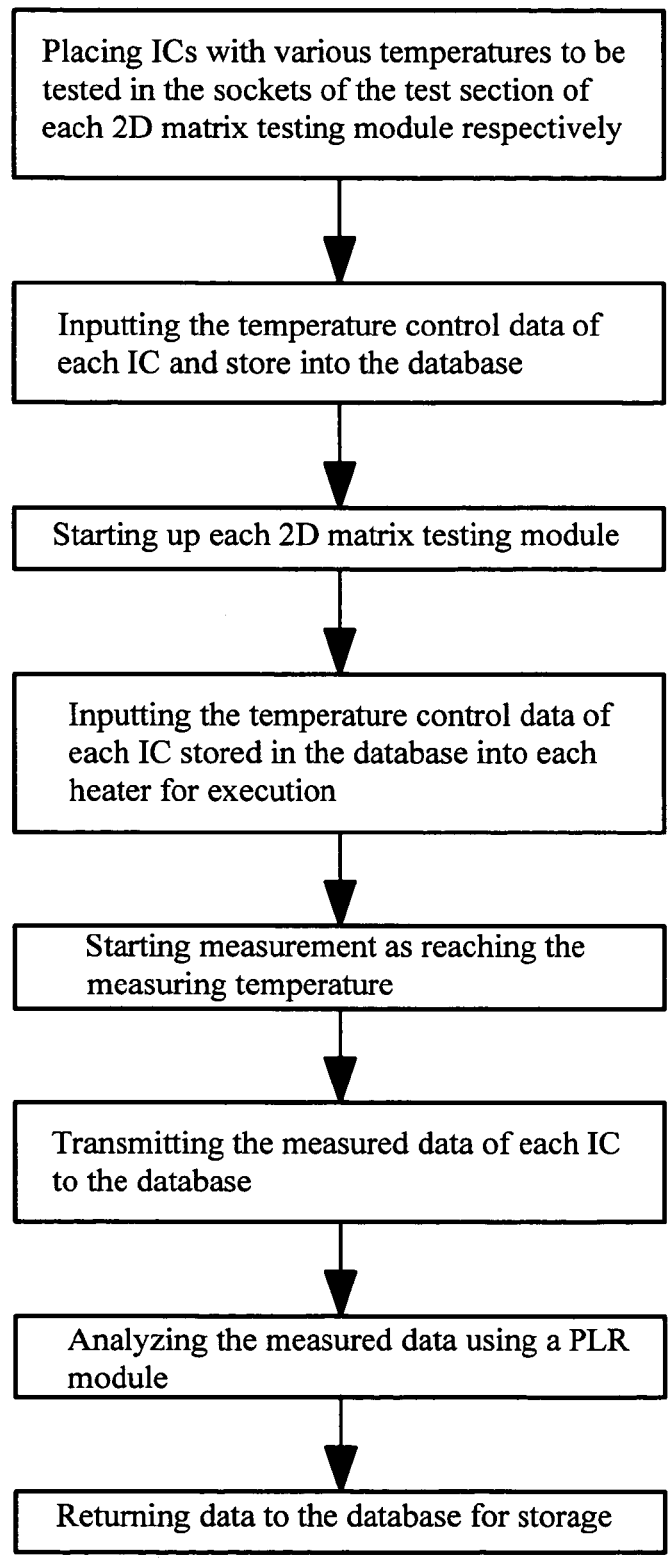
FIG. 5 is a flow chart of testing with the system for testing integrated circuits according to the invention.

For carrying out a test with a testing system having the above-described structure, as shown in FIG. 1 and FIG. 5, integrated circuits 9 with various temperatures to be tested are placed in each socket in the testing section of the two-dimensional matrix module 1. The temperature control data of each integrated circuit 9 is then input and stored in the database 7. Each two-dimensional matrix testing module 1 is started up by using the computer mainframe 6 to input the temperature control data of the integrated circuits 9 set in the database 7 into each heater 33. After using heater 33 to heat one to one, and controlling the temperature of the integrated circuit 9 till each integrated circuit 9 reach the temperature to be measured, measurements can be carried out. In the meantime, the measured data of each integrated circuit 9 are transmitted to the database 7, where the measured data of each integrated circuit 9 are analyzed by using said PLR module 8 and the analyzed data are then returned to the database 7 for storing.

As the testing completes, the integrated circuit 9 in the two-dimensional matrix testing module 1 of the chamber 4 can be cooled rapidly by using the cooling unit 5.

By the presentation of the above-described embodiment, it can be seen that the present invention has following advantages:

1. Each integrated circuit 9 with various temperature environment to be tested can be heated in the same time, thus the total time horizon of testing can be shortened and the total cost of testing can be reduced.

2. As integrated circuit 9 is contacted with the heater 33 and can be heated one to one, and the temperature of the integrated circuit 9 can be controlled and heated stably, the situation of heating unevenly or over heated can never happen.

3. As rapid cool is possible after testing, the total time horizon of testing can be shorten, which is advantageous for carrying out the subsequent testing.

Many changes and modifications in said described embodiment of the invention can, of course, be carried out without departing from the scope thereof. Accordingly, to promote the progress in science and the useful arts, the invention is disclosed and is intended to be limited only by the scope of the appended claims.

What is claimed is:

1. A system for testing integrated circuits by testing the change of integrated circuits under various temperatures, said system for testing integrated circuits comprises:
    at least one two-dimensional matrix testing modules, consisting of: a testing section, provided with arrays for the insertion of multiple integrated circuits to be tested, a heating section corresponding with said testing section,
    wherein said arrays are provided with multiple heaters in a manner that said integrated circuits can be heated respectively;
    a computer mainframe, for connecting said two-dimensional matrix testing module and hence controlling the whole operations of the testing system; and
    a database, connecting to said two-dimensional matrix testing module via said computer mainframe for storing the temperature control data, providing each of said heaters on said heating section for generating a suitable temperature, heating the integrated circuit to be tested, and storing the test information,
    wherein each of said heaters corresponding to each socket seat of said two-dimensional matrix testing module are independent each other, and
    wherein the related test temperature of each integrated circuit to be tested can transmit to each heater for execution under the control of said computer mainframe, and, the test information of each integrated circuit can be transmitted into the computer mainframe and stored in the database.

2. A system for testing integrated circuits according to claim 1, wherein said two-dimensional matrix testing module comprises:
    a testing section, comprising a semiconductor circuit provided on a semiconductor test board, and multiple sockets provided on said semiconductor testing board, which can be plugged with integrated circuits to be tested respectively, wherein said multiple sockets are connected to said semiconductor testing circuit respectively;
    a heating section, provided corresponding to said testing section, and comprising a control circuit provided on said substrate, and multiple heaters provided on said substrate corresponding to said multiple sockets, wherein said multiple heaters are connect to said control circuits, respectively;
    wherein, said control circuits can transmit the test information of desired temperature of every integrated circuit to be tested to the corresponding heater for execution, and output the test information of the integrated circuits from said semiconductor test circuit.

3. A system for testing integrated circuits according to claim 2, wherein said computer mainframe comprises:
    a procedure controlling unit which can read the temperature control data in the database, and input the test information received from each integrated circuit into said database;
    a temperature controlling unit which can input the temperature control data of each integrated circuits to be tested which located at different position into each specific position of each two-dimensional matrix module for execution respectively;
    a signal output unit which connects each semiconductor testing circuit of said two-dimensional matrix testing module, detect the pressure coefficient of each integrated circuit in said two-dimensional matrix testing module and transmits the test information to said procedure controlling unit; and
    a measuring unit which connects to each semiconductor testing circuit in said two-dimensional matrix testing module, transmits the test information of the characteristic change under various specific temperatures of each integrated circuit in each two-dimensional matrix testing module to said procedure controlling unit.

4. A system for testing integrated circuits according to claim 1, wherein said two-dimensional matrix testing module can be in multiple form and forms a three-dimension matrix.

5. A system for testing integrated circuits according to claim 1, wherein said at least one two-dimensional matrix testing modules can be installed into the chamber.

6. A system for testing integrated circuits according to claim 5, wherein said chamber is connected to a cooling unit which provides fast cooling of said integrated circuits in said two-dimensional matrix testing module after testing.

7. A system for testing integrated circuits according to claim 1, wherein said test information stored in the database can be analyzed by a PLR module and the analyzed data is then returned to the database.

8. A heater structure, plugged on a substrate of a heating section of a two-dimensional matrix testing module for heating integrated circuits in the testing section, which comprises:
    a top seat, provided thereon a socket unit;
    a heating column, installed beneath said top seat, and provided with an offseter bulged out the bottom of said heating column;
    a connection unit which connect said top seat and said heat column;
    a heating circuit, provided by penetrating through said heating column and for heating the heating column;
    a temperature sensing circuit which penetrates through said heating column to sense the temperature of the offseter at the bottom of the heating column;
    wherein, by contacting said offseter to said integrated circuit, the integrated circuit is heated up to a prescribed testing temperature, and, when the temperature of the offseter is higher than said prescribed testing temperature of said integrated circuit, said temperature sensing circuit can sense the signal and stop the heating of the heating circuit.

9. A heater structure according to claim 8, wherein said connection unit has multiple plug bars whose both ends connect to said top seat and said heating column respectively.

10. A heater structure according to claim 9, wherein a flexible unit is further provided around said plug bar between said top seat and said heating column.

11. A heater structure according to claim 10, wherein a pressure gauge is further installed between said top seat and said heating column, which is used for measuring the pressure change after said heating column contacting said integrated circuit to be tested.

12. A heater structure according to claim 10, wherein said flexible unit can be a compressive spring.

13. A heater structure according to claim 8, wherein said socket unit can be inserted on the substrate for positioning said heater.

* * * * *